(12) United States Patent
Pan et al.

(45) Date of Patent: Mar. 1, 2005
(10) Patent No.: US 6,861,676 B2

(54) FABRICATING PROCESS FOR FORMING FLEXIBLE SUBSTRATE

(75) Inventors: Cheng-Tang Pan, Tainan (TW); Hung-Yi Lin, Hsinchu (TW); Wu-Tung Chuan, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 504 days.

(21) Appl. No.: 09/983,827

(22) Filed: Oct. 26, 2001

(65) Prior Publication Data

US 2003/0081166 A1 May 1, 2003

(51) Int. Cl.[7] .............................................. H01L 39/227
(52) U.S. Cl. ............................................. 257/98; 349/69
(58) Field of Search ................................ 257/99; 349/69

(56) References Cited

U.S. PATENT DOCUMENTS 6,195,142 B1 * 2/2001 Gyotoku et al. ............... 349/69
6,639,250 B1 * 10/2003 Shimoda et al. ............... 257/98

* cited by examiner

Primary Examiner—John F. Niebling
Assistant Examiner—Andre' C. Stevenson
(74) Attorney, Agent, or Firm—Troxell Law Office, PLLC (57) ABSTRACT

The present invention provides a fabricating process for forming a flexible substrate, including the steps of: providing the substrate which is composed of a top plate and a bottom plate, and then a positive electrode layer and a organic electro-luminescence (EL) are formed in sequence on the bottom plate; after that, a same axial downward patterned template is pressed onto the bottom plate for "micro-patterning", and thus the positive electrode layer and the organic electro-luminescence (EL) layer on the bottom plate are patterned in the same axial; providing a top plate, on which a metal layer as a negative electrode is formed; similarly, a same axial upper patterned template is pressed onto the top plate for "micro-patterning", and thus the metal layer on the top plate is patterned in the same axial; finally, superimposing the top plate on the bottom plate so that the axis of patterned positive electrode layer and patterned organic EL layer crisscross with the axis of patterned metal layer to construct a chessboard-like structure.

4 Claims, 7 Drawing Sheets

FABRICATING PROCESS FOR FORMING FLEXIBLE SUBSTRATE

BACKGROUND OF THE INVENTION

1. Field of the Invention

The present invention generally relates to a fabricating process for forming a flexible substrate, and more particularly, to a fabricating process for forming a flexible substrate for use in an organic electro-luminescence display, so as to overcome the problems such as the moisture during photolithography process and poor transparency of the photo-resist, reduce the pixel size and thus improve the reliability and resolution.

2. Description of the Prior Art

In recent years, the photo-electronic industry has become one of the most promising and competitive prospects. In particular, the organic electro-luminescence display (OELD) is considered the future flat display due to its outstanding characteristics such as self-lighting, high brightness, high resolution, and good contrast. However, the state-of-the-art technology related to the fabrication of such a display is still far from perfect, thus lots of efforts on research are under way.

The basic configuration of an organic electro-luminescence element is a laminated structure comprising a transparent conductive layer for the positive electrode, a metal electrode for the negative electrode, and an organic electro-luminescence (EL) layer sandwiched between the negative electrode and the positive electrode. A metal mask was used for fabrication. Nowadays. A photo-resist layer is commonly used, instead of the metal mask, in the industry. For example, the U.S. Pat. No. 6,025,894 discloses an organic electro-luminescence display, in which an organic electro-luminescence layer sandwiched between a front electrode and a back electrode is supplied with a driving voltage. And also, in the U.S. Pat. No. 6,165,384, there is provided a fluorescent dye composition for inclusion in a fluid for leak detection applications, which is responsive to a broad range of light sources.

Please refer to FIG. 1, which schematically illustrates the fabrication method in accordance with the prior art. To begin with, there is provided a substrate 10, on which a patterned transparent conductive layer 15 is formed by using indium tin oxide (ITO) or indium oxide as the positive electrode for emitting holes, as shown in FIG. 1A.

Figure 1A:
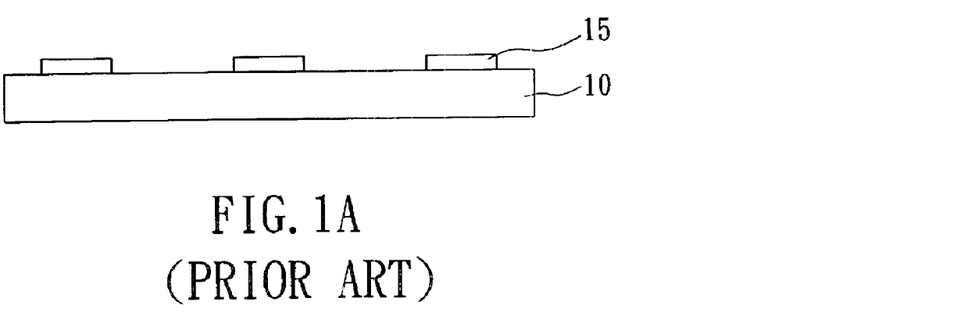
FIG. 1A to FIG. 1D schematically illustrate the fabrication method in accordance with the prior art.
Figure 1B:
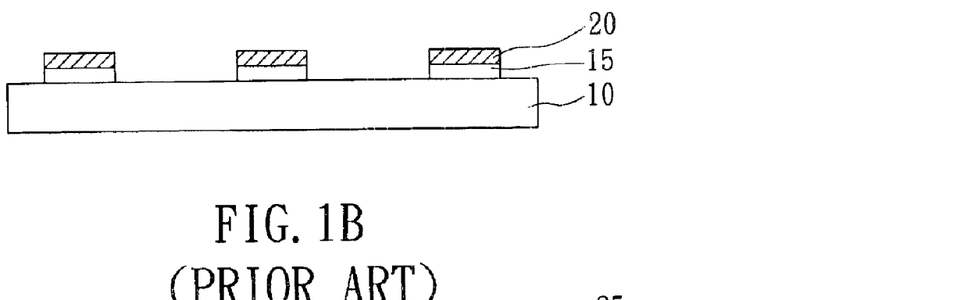

An interlayer 20 is formed on the transparent conductive layer 15, as shown in FIG. 1B. The interlayer 20 is an electron/hole transmitting layer (ETL/HTL), which helps to improve carrier transport.

Figure 1C:
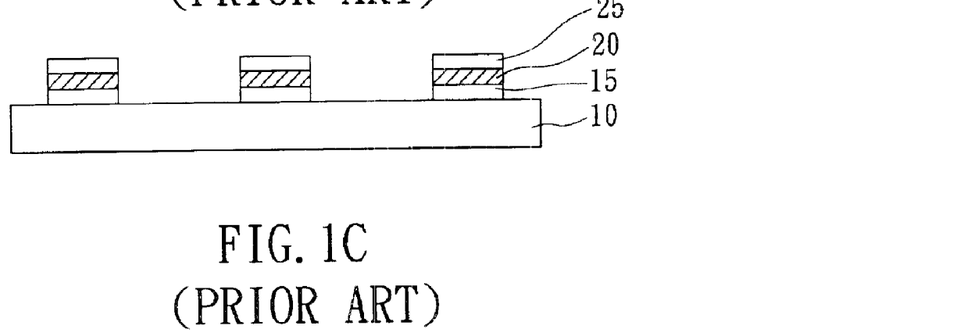

Then, an organic layer 25 is deposited on the interlayer 20, as shown in FIG. 1C. The organic layer 25 is composed of an organic electro-luminescence material or a fluorescent dye composition. When a voltage is applied, a broad range of light is emitted from the organic layer 25 or the opposing surfaces of the organic layer 25.

Figure 1D:
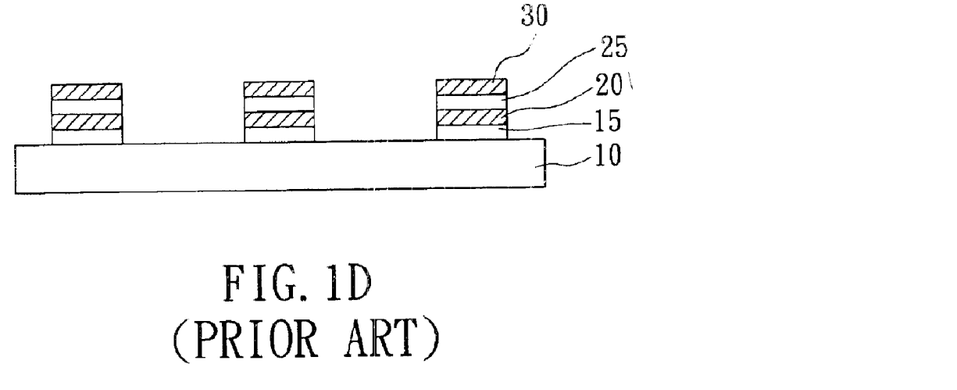

Finally, a metal layer 30 is deposited on the organic layer 25, functioning as the negative electrode, as shown in FIG. 1D. The metal layer 30 is composed of inertial metal such as Al, In, Ag and Au, and is used as an electron emitting layer.

In addition, when a voltage is applied, the electric field causes the holes and the electrons to be emitted from the positive electrode and the negative electrode, respectively. The holes and the electrons recombine as excitons in the organic layer 25, and then the light is emitted due to exciton transition from the excited state to the ground state.

However, in the prior art, the substrate is made of glass, which is not suitable for displays with a curved surface. Moreover, when the organic material is employed, it often results in failure due to the moisture during photolithography process and poor transparency of the photo-resist. Furthermore, the metal lines fall off the substrate easily and it leads to shorter lifetime. Accordingly, the products thus made suffer from poor reliability and low fabrication yield for large-size display, which adversely affects the resolution.

Therefore, the present invention provides a fabricating process for forming a flexible substrate, which is used to overcome the problems in the prior art and improve the reliability and resolution.

SUMMARY OF THE INVENTION

It is the primary object of the present invention to provide a fabricating process for forming a flexible substrate, which relates to a fabricating process for forming a flexible substrate for use in an organic electro-luminescence display, so as to overcome the problems such as the moisture during photolithography process and poor transparency of the photo-resist, reduce the pixel size and thus improve the reliability and resolution.

It is another object of the present invention to employ a Lithographie-Galvanoformung-Abformung (LIGA) technique, in which a flexible substrate of an organic electro-luminescence display is fabricated by using a plastic or polymer substrate so as to form a curved surface to improve the light characteristics and eliminate the chromatic aberration.

It is still another object of the present invention to provide a fabricating process for forming an organic electro-luminescence display, in which a substrate is composed of a top plate and a bottom plate. The fabricating sequence for forming the top plate and the bottom plate can be inversed according to actual requirement, and then the top plate is superimposed onto the bottom plate, so as to construct a chessboard-like structure and thus form an organic electro-luminescence display with a curved surface on a flexible substrate.

In order to achieve the foregoing objects, the present invention provides a fabricating process for forming a flexible substrate, comprising the steps of:

providing the substrate which is composed of a top plate and a bottom plate, and then a positive electrode layer functions as emitting electrons and a organic electro-luminescence (EL) layer are formed in sequence on the bottom plate; after that, a same axial downward patterned template is pressed onto the bottom plate for "micro-patterning", and thus the positive electrode layer and the organic electro-luminescence (EL) layer on the bottom plate are patterned in the same axial;

providing a top plate, on which a metal layer as a negative electrode functions as emitting electrons is formed; Similarly, a same axial upper patterned template is pressed onto the top plate for "micro-patterning", and thus the metal layer on the top plate is patterned in the same axial; finally, superimposing the top plate on the bottom plate so that the axis of patterned positive electrode layer and patterned organic EL layer crisscross with the axis of patterned metal layer to construct a chessboard-like structure.

Certainly, the fabricating sequence for forming the top plate and the bottom plate can be inversed according to actual requirement, such as a positive electrode layer is formed on the bottom plate, and then a same axial downward patterned template is pressed onto the bottom plate for "micro-patterning", and thus the positive electrode layer on the bottom plate is patterned in the same axial; a metal layer and a organic electro-luminescence (EL) layer are formed in sequence on the top plate, and then a same axial upper patterned template is pressed onto the bottom plate for "micro-patterning", and thus the metal layer and the organic electro-luminescence (EL) layer on the top plate is patterned in the same axial; finally, superimposing the top plate on the bottom plate to construct a chessboard-like structure.

It is preferable that each of said top plate and said bottom is composed of a plastic material.

It is preferable that each of said top plate and said bottom is composed of a polymer material.

It is preferable that said metal layer functions as a negative electrode for emitting electrons.

It is preferable that said metal layer is composed of inertial metal such as Al, In, Ag, Au, and the alloy thereof.

It is preferable that said organic EL layer is composed of an organic electro-luminescence polymer material.

It is preferable that said organic EL layer is composed of a fluorescent dye composition.

It is preferable that a broad range of light is emitted from said organic EL layer or the opposing surfaces of said EL layer when a voltage is applied.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing a fabricating process for forming a flexible substrate for use in an organic electro-luminescence display (OELD) by using a Lithographie-Galvanoformung-Abformung (LIGA) technique can be exemplified by two preferred embodiments as described hereinafter.

First Embodiment

Figure 2A:
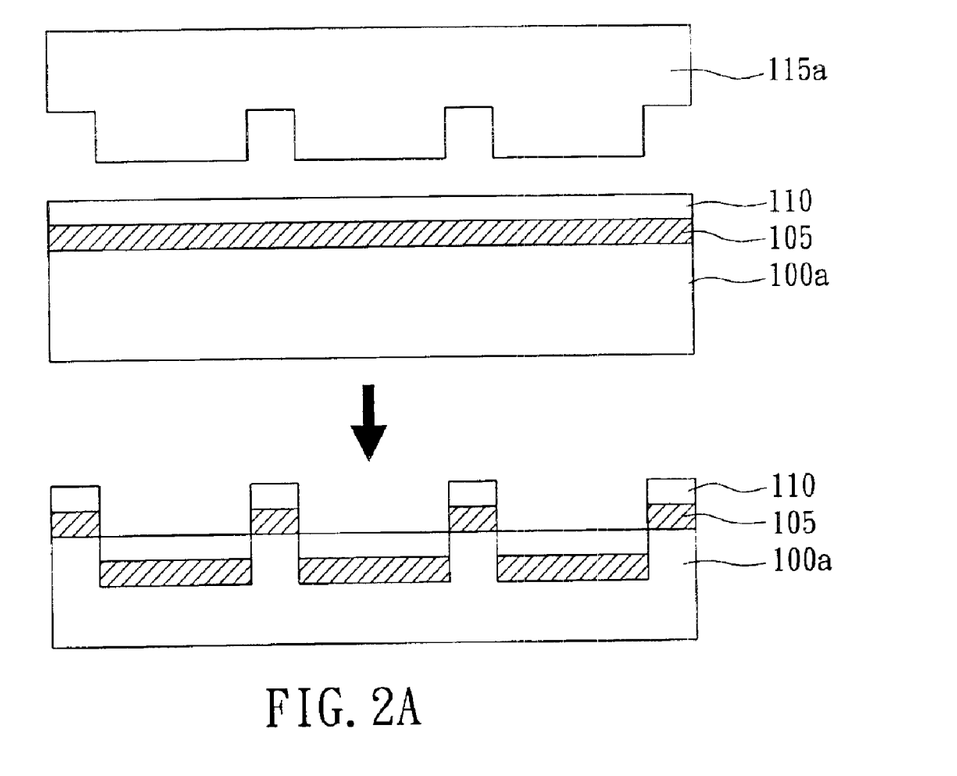
FIG. 2A and FIG. 2B schematically illustrate the fabrication method for forming a bottom plate of a flexible substrate in accordance with the first embodiment of the present invention.
Figure 2B:
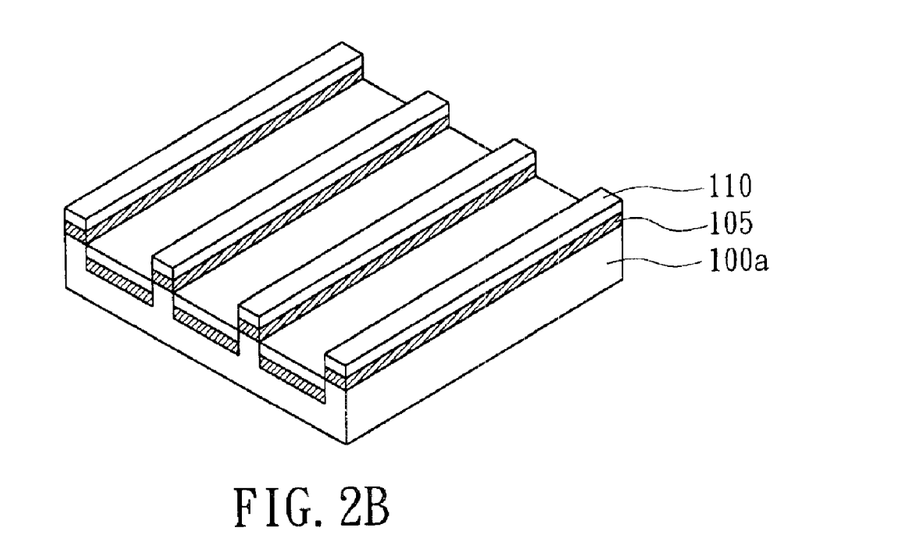

Please refer to FIG. 2A and FIG. 2B, which schematically illustrate the fabrication method for forming a bottom plate of a flexible substrate in accordance with the first embodiment of the present invention. In the present embodiment, the substrate is composed of a top plate and a bottom plate. In FIG. 2A, a positive electrode layer 105 is formed on a bottom plate 100a. Then, an organic electro-luminescence (EL) layer 110 is formed on the positive electrode layer 105.

The bottom plate 100a is composed of a plastic or polymer material, such as epoxy resin. The positive electrode layer 105 is a transparent conductive layer, having a surface resistance within the range of 0.1 to 5Ω, and is formed by using indium tin oxide (ITO), indium oxide or doped conductive polymer (such as conjugate polymer) for emitting holes. The organic EL layer 110 is composed of an organic electro-luminescence polymer material or a fluorescent dye composition. When a voltage is applied, a broad range of light is emitted from the organic EL layer 110 or the opposing surfaces of the EL layer 110.

Later, a downward patterned template 115a is pressed onto the bottom plate 100a for "micro-patterning", and thus the positive electrode layer 105 and the organic EL layer 110 on the bottom plate 100a are patterned, as shown in FIG. 2B.

Figure 3A:
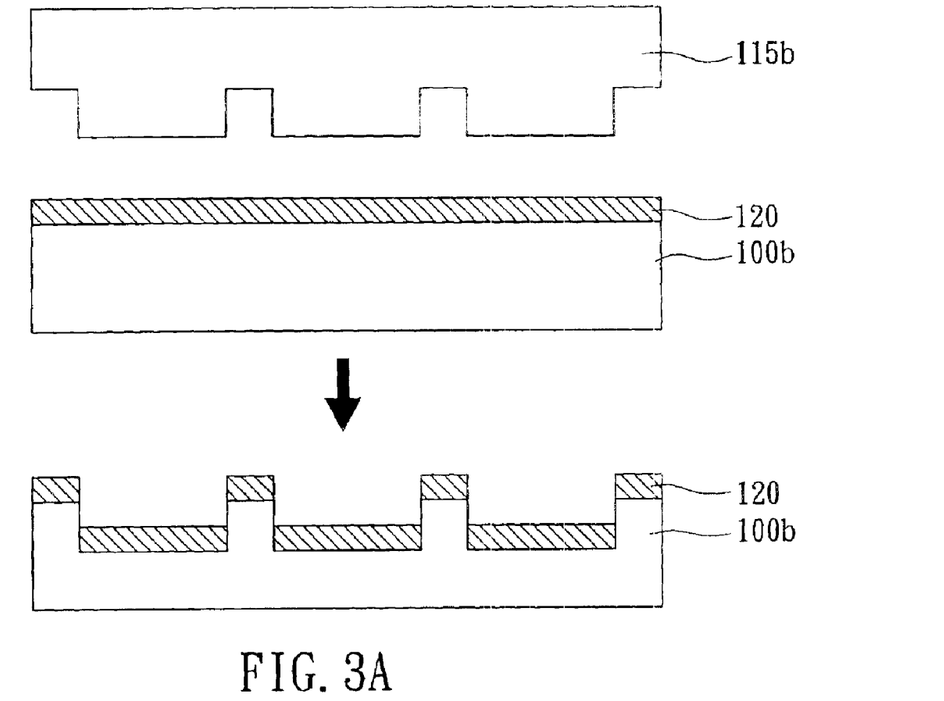
FIG. 3A and FIG. 3B schematically illustrate the fabrication method for forming a top plate of a flexible substrate in accordance with the first embodiment of the present invention.
Figure 3B:
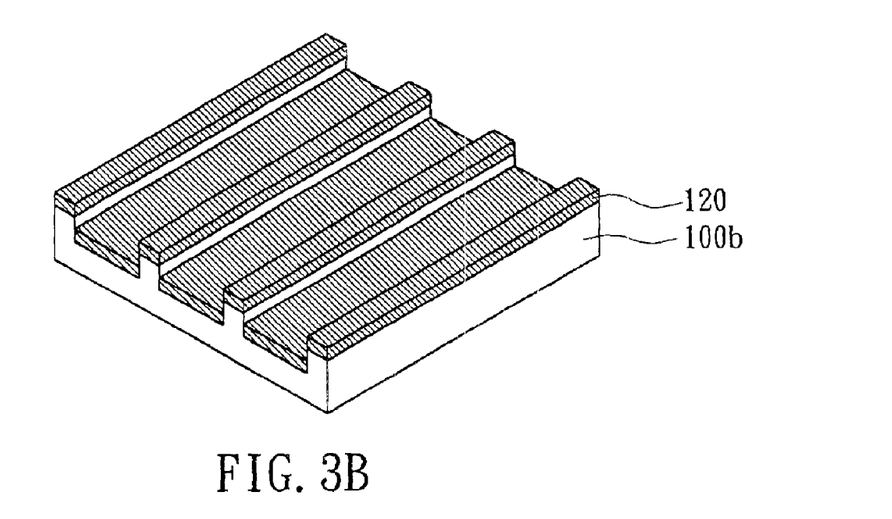

Please further refer to FIG. 3A and FIG. 3B, which schematically illustrate the fabrication method for forming a top plate of a flexible substrate in accordance with the first embodiment of the present invention. In FIG. 3A, a metal layer 120 is deposited as a negative electrode layer on a top plate 100b. The metal layer 120 is composed of inertial metal such as Al, In, Ag, Au, and the alloy thereof, and is used as an electron-emitting layer. An interlayer (shown in the figure) is then formed on the metal layer 120. The interlayer is formed by using an organic EL layer, comprising an electron transmitting layer (ETL) and a hole-transmitting layer (HTL). Moreover, an enhancement hole transmitting layer is formed on the hole transmitting layer, which helps to improve carrier transport.

Similarly, an upper patterned template 115b is pressed onto the top plate 100b for "micro-patterning", and thus the metal layer 120 on the top plate 100b is patterned, as shown in FIG. 3B.

Figure 4:
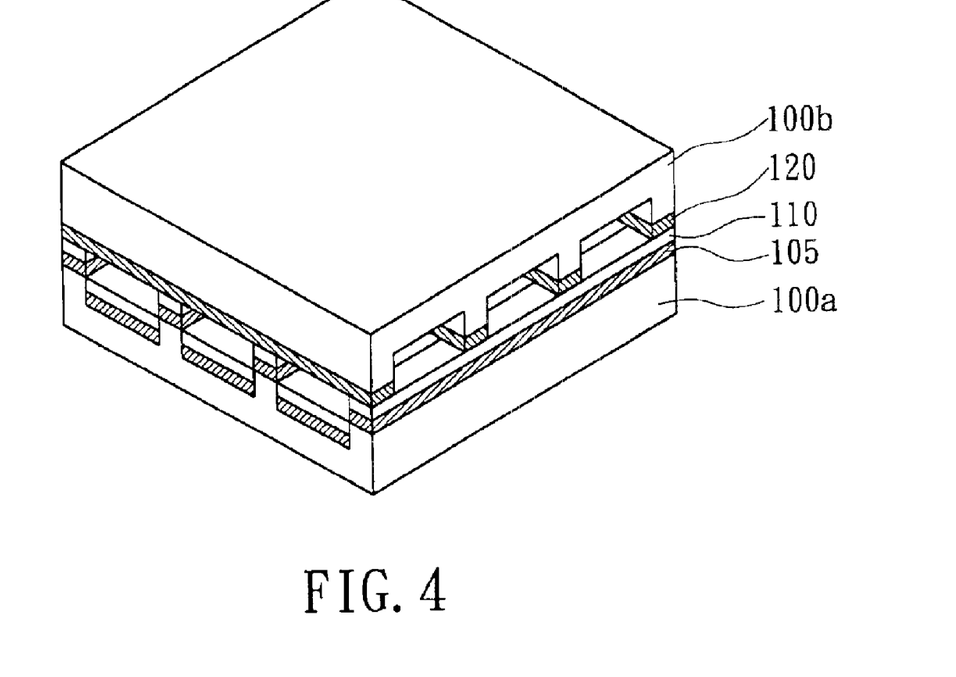
FIG. 4 schematically illustrates the fabrication method for forming a flexible substrate by superimposing the top plate on the bottom plate in accordance with the first embodiment of the present invention.

Finally, the top plate 100b is superimposed on the bottom plate 100a so that the pattern on the positive electrode layer 105 and the organic EL layer 110 and the pattern on the metal layer 120 construct a chessboard like structure, as shown in FIG. 4.

Second Embodiment

Figure 5A:
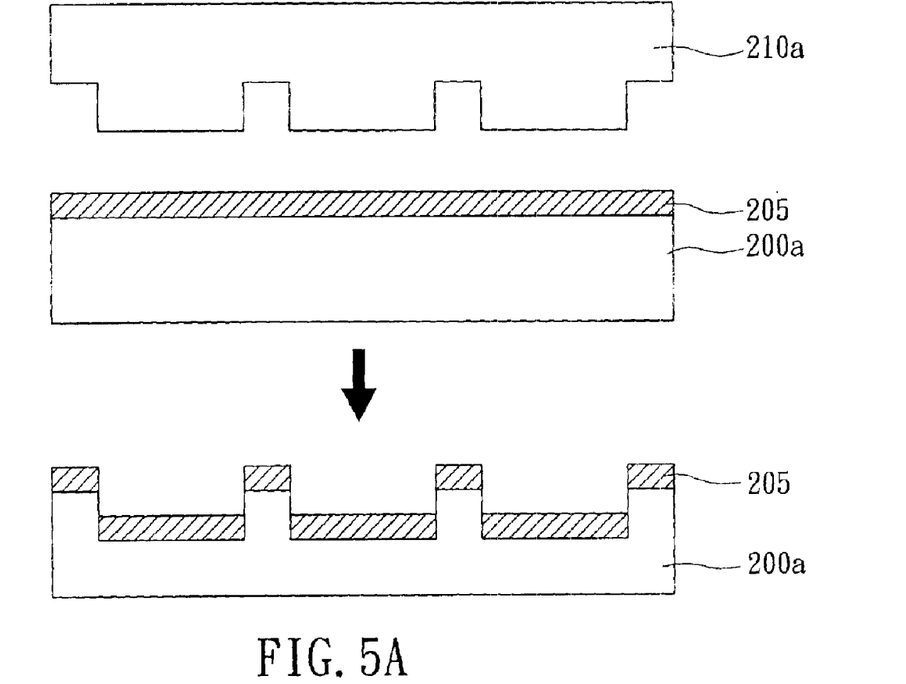
FIG. 5A and FIG. 5B schematically illustrate the fabrication method for forming a bottom plate of a flexible substrate in accordance with the second embodiment of the present invention.
Figure 5B:
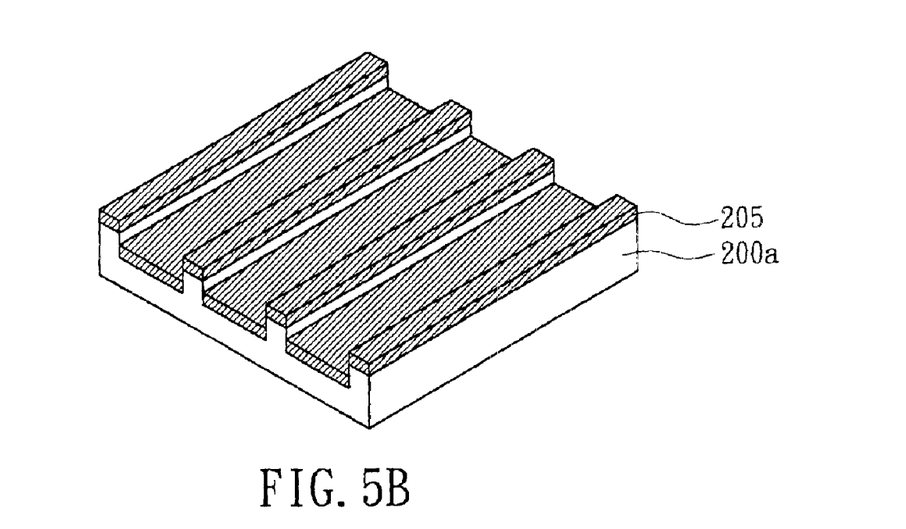

Please refer to FIG. 5A and FIG. 5B, which schematically illustrate the fabrication method for forming a bottom plate of a flexible substrate in accordance with the second embodiment of the present invention. In the present embodiment, the substrate is composed of a top plate and a bottom plate. In FIG. 5A, a positive electrode layer 205 is formed on a bottom plate 200a.

Similarly, the bottom plate 200a is composed of a plastic or polymer material, such as epoxy resin. The positive electrode layer 205 is a transparent conductive layer and is formed by using indium tin oxide (ITO), indium oxide or doped polymer (such as conjugate polymer) for emitting holes.

Figure 6A:
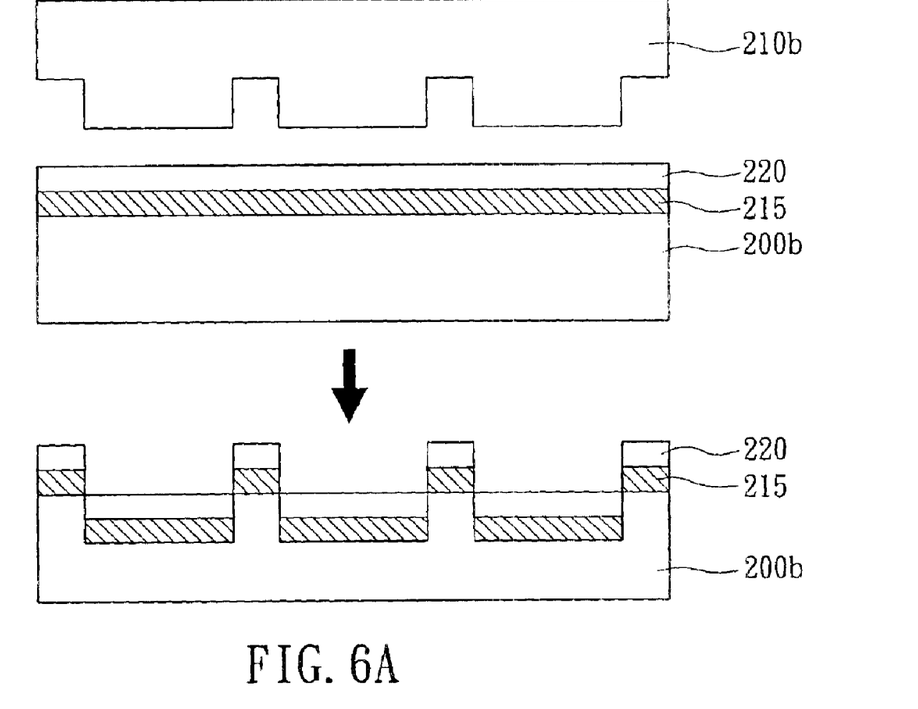
FIG. 6A and FIG. 6B schematically illustrate the fabrication method for forming a top plate of a flexible substrate in accordance with the second embodiment of the present invention.

Later, a downward patterned template 210a is pressed onto the bottom plate 200a for "micro-patterning", and thus the positive electrode layer 205 on the bottom plate 200a are patterned, as shown in FIG. 5B Please further refer to FIG. 6A and FIG. 6B, which schematically illustrate the fabrication method for forming a top plate of a flexible substrate in accordance with the second embodiment of the present invention. In FIG. 6A, a metal layer 215 is deposited as a negative electrode layer on a top plate 200b. Then, an organic electro-luminescence (EL) layer 220 is formed on the metal layer 215.

The metal layer 215 is composed of inertial metal such as Al, In, Ag, Au, and the alloy thereof, and is used as an electron-emitting layer. An interlayer (shown in the figure) is then formed on the metal layer 215 The interlayer is formed by using an organic EL layer, comprising an electron transmitting layer (ETL) and a hole transmitting layer (HTL). Moreover, an enhancement hole transmitting layer is formed on the hole transmitting layer, which helps to improve carrier transport.

The organic EL layer 220 is composed of an organic electro-luminescence polymer material or a fluorescent dye composition. When a voltage is applied, a broad range of light is emitted from the organic EL layer 220 or the opposing surfaces of the EL layer 220.

Figure 6B:
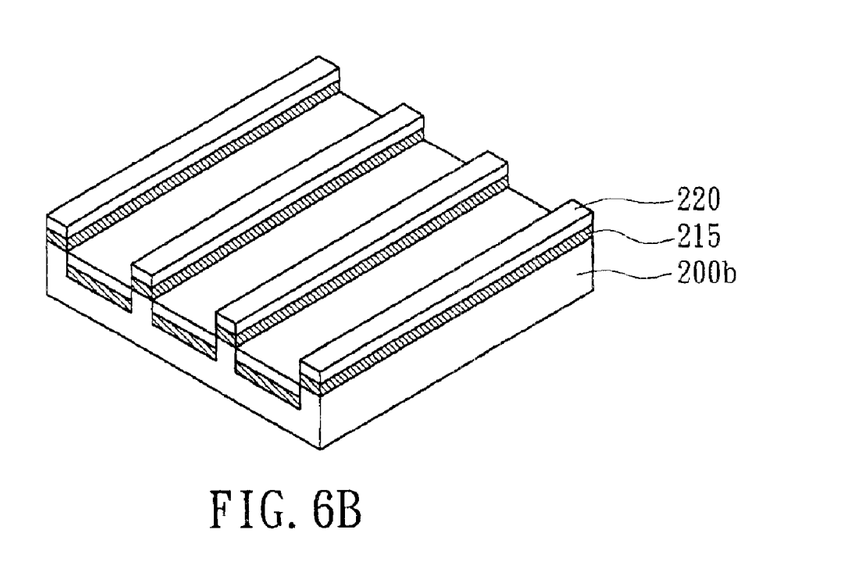

Similarly, a upper patterned template 210b is pressed onto the top plate 200b for "micro-patterning", and thus the metal layer 215 and the organic EL layer 220 on the top plate 200b are patterned, as shown in FIG. 6B.

Figure 7:
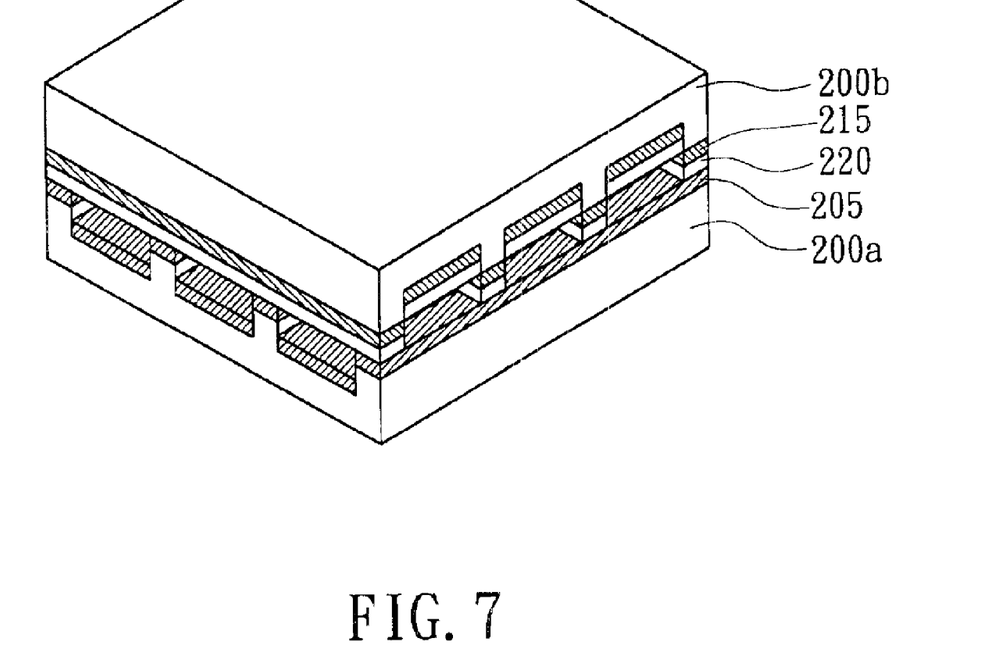
FIG. 7 schematically illustrates the fabrication method for forming a flexible substrate by superimposing the top plate on the bottom plate in accordance with the second embodiment of the present invention.

Finally, the top plate 200b is superimposed on the bottom plate 200a so that the pattern on the metal layer 215 and the organic EL layer 220 and the pattern on the positive electrode layer 205 construct a chessboard-like structure.

The present invention is exemplified by an organic electro-luminescence display (OELD), in which the substrate is composed of a top plate and a bottom plate. The fabricating sequence for forming the top plate and the bottom plate can be inversed according to actual requirement, according to actual requirement, and then the top plate is superimposed onto the bottom plate, so as to construct a chessboard-like structure and thus form an organic electro-luminescence display with a curved surface on a flexible substrate. The present invention employs a Lithographie-Galvanoformung-Abformung (LIGA) technique so as to overcome the problems such as the moisture during photolithography process and poor transparency of the photo-resist, reduce the pixel size and thus improve the reliability and resolution. In addition, the present invention employs a flexible substrate fabricated by using a plastic or polymer substrate so as to form a curved surface to improve the light characteristics and eliminate the chromatic aberration.

To sum up, in accordance with the present invention, a fabricating process for forming a flexible substrate for use in an organic electro-luminescence display (OELD) has the following advantages:

(a) reduction in moisture during photo-lithography process as well as the damage in the organic layer;
(b) longer lifetime;
(c) higher response speed;
(d) higher resolution;
(e) better consistence in the pixels;
(f) simplified fabrication procedure; and
(g) lower cost.

As described above, the present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A fabricating process for forming a flexible substrate, comprising the steps of:
   (a) providing a top plate, on which a first axial patterned metal layer is formed as a negative electrode;
   (b) providing a bottom plate, on which a second axial patterned positive electrode layer and a second axial patterned organic electro-luminescence (EL) layer are formed in sequence; and
   (c) superimposing said top plate on said bottom plate so that the pattern on said second axial positive electrode layer and said second axial organic EL layer and the pattern on said first axial metal layer construct a chessboard-like structure,
   wherein each of said top plate and said bottom is composed of a plastic material.

2. A fabricating process for forming a flexible substrate, comprising the steps of:
   (a) providing a top plate, on which a first axial patterned metal layer is formed as a negative electrode;
   (b) providing a bottom plate, on which a second axial patterned positive electrode layer and a second axial patterned organic electro-luminescence (EL) layer are formed in sequence; and
   (c) superimposing said top plate on said bottom plate so that the pattern on said second axial positive electrode layer and said second axial organic EL layer and the pattern on said first axial metal layer construct a chessboard-like structure,
   wherein each of said top plate and said bottom is composed of a polymer material.

3. A fabricating process for forming a flexible substrate, comprising the steps of:
   (a) providing a top plate, on which a first axial patterned metal layer and a first axial patterned organic electro-luminescence (EL) layer are formed;
   (b) providing a bottom plate, on which a second axial patterned positive electrode layer is formed; and
   (c) superimposing said top plate on said bottom plate so that the pattern on said first axial metal layer and said first axial organic EL layer and the pattern on said second axial positive electrode layer construct a chessboard-like structure,
   wherein each of said top plate and said bottom is composed of a plastic material.

4. A fabricating process for forming a flexible substrate, comprising the steps of:
   (a) providing a top plate, on which a first axial patterned metal layer and a first axial patterned organic electro-luminescence (EL) layer are formed;
   (b) providing a bottom plate, on which a second axial patterned positive electrode layer is formed; and
   (c) superimposing said top plate on said bottom plate so that the pattern on said first axial metal layer and said first axial organic EL layer and the pattern on said second axial positive electrode layer construct a chessboard-like structure,
   wherein each of said top plate and said bottom is composed of a polymer material.

* * * * *